United States Patent
Ribellino et al.

(10) Patent No.: US 6,285,233 B1
(45) Date of Patent: Sep. 4, 2001

(54) LOW CONSUMPTION ELECTRONIC LEVEL SHIFTER DEVICE

(75) Inventors: Calogero Ribellino, Sommatino; Patrizia Milazzo, Messina, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/429,779

(22) Filed: Oct. 28, 1999

(30) Foreign Application Priority Data

Oct. 28, 1999 (EP) .................................................. 98830653

(51) Int. Cl.[7] .................................................. H03L 5/00
(52) U.S. Cl. .................................................. 327/333; 326/81
(58) Field of Search ........................ 326/80, 81; 327/319, 327/333

(56) References Cited

U.S. PATENT DOCUMENTS

| | | | |
|---|---|---|---|
| 5,153,451 | * 10/1992 | Yamamura et al. | 307/264 |
| 5,317,249 | 5/1994 | Ford | 320/2 |
| 5,371,419 | 12/1994 | Sundby | 327/543 |
| 5,754,480 | 5/1998 | Sato | 365/189.05 |
| 5,786,723 | * 7/1998 | Kim | 327/530 |
| 6,052,021 | * 4/2000 | Hieda | 327/565 |
| 6,087,879 | * 7/2000 | Takahashi et al. | 327/333 |
| 6,094,083 | * 7/2000 | Noda | 327/333 |
| 6,133,752 | * 10/2000 | Kawagoe | 326/55 |

FOREIGN PATENT DOCUMENTS

| | | |
|---|---|---|
| 03179814 | 8/1991 | (JP) . |
| 05083104 | 4/1993 | (JP) . |

* cited by examiner

Primary Examiner—Jeffrey Zweizig
(74) Attorney, Agent, or Firm—Theodore E. Galanthay; Robert Iannucci; Seed IP Law Group, PLLC

(57) ABSTRACT

An electronic level shifter device having very low power consumption includes a first voltage reference from a power supply and a second voltage reference from a ground. The shifter device includes a circuit portion with a differential cell having an output terminal and at least a first and a second input terminal. On the output terminal is a level translated signal with respect to a signal present on one of said input terminals. The device further comprises an additional circuit portion connected to a node of the differential cell and comprising at least a pull-down component inserted between said node and the second voltage reference. The pull-down component can be a MOS transistor having its conduction terminals connected between said node and the second voltage reference and its gate terminal connected to the first voltage reference of power supply by means of a series of transistors.

19 Claims, 5 Drawing Sheets

US 6,285,233 B1

LOW CONSUMPTION ELECTRONIC LEVEL SHIFTER DEVICE

TECHNICAL FIELD

The present invention relates to an electronic level shifter device with very low power consumption.

BACKGROUND OF THE INVENTION

The present invention derives from the development of a management device (Power Management) designed to reduce to a minimum the power consumption in portable electronic instruments provided with batteries, such as for example cellular phones or portable computers, and the description hereinbelow makes reference to this specific field of application to simplify the illustration without limiting the invention to these applications. Discussion of steps well know to those skilled in the art has been abbreviated or eliminated for brevity.

The above device is substantially an interface between a battery charger and the main battery of the portable electronic instrument. The main task of this device is that of controlling the charge of the battery.

Further on, other tasks are referable to the above mentioned device, such as: the continuous monitoring of the battery voltage, the charge and the monitoring of the backup battery, and the management of the consumption during the different operational states of the portable electronic instrument.

In this specific field of application, the requirement of reducing to the minimum the consumption of the integrated circuits incorporated in the portable electronic instrument and supplied by batteries is particularly felt.

The controllers employed in the prior art for this purpose in the modern cellular phones use a very high number of level shifter devices in order to manage at least three different independent power supplies, by interfacing with the digital portion of the (Universal Energy Management) UEM device, which operates with different power supplies.

In FIG. 1, a level shifter 20 with differential cell of known type is shown as an example, which is supplied between a first reference 21 of voltage Vout and a second reference GND. The shifter 20 has two signal input terminals 22 and 23 and an output terminal OUT.

The power supply Vout corresponds to the value of voltage produced on the output terminal OUT. The first input 22 receives a voltage signal VIN, while the second input 23 receives a signal IN.

As an example, if the signal IN on the input 23 is at the logic value "1", the NMOS transistor M1 is off (because the signal IN is inverted to a logic 0 by an inverter prior to presenting it to the gate of the transistor M1) and the NMOS transistor M2 is on, thereby pulling the node B to ground. Accordingly, the PMOS transistor M4 is on and brings the node A to a potential value equal to that of the power supply VOUT. The output OUT has therefore the logic value "1", although it is translated into the value of the power supply VOUT.

If the signal VIN is annulled or off, then also the signal IN is brought to zero in such a way that a voltage value equal to 0V is applied to each of the gate terminals of the transistors M1 and M2. In such a condition, both the nodes A and B remain floating and therefore can position themselves in an indefinite state, thus not ensuring in output the desired logic signal "0", to be compared with the above mentioned values of voltage in input.

The prior art already proposes a solution in order to solve the problem. Such solution consists in utilizing a "pull-up" component 25 on the node B so as to force the voltage at that point to the value of the power supply VOUT when the signal VIN is not present, in order to guarantee the logic state "0" on the output OUT in these conditions. Such a "pull-up" component can be formed in many ways, for example by means of a resistance or with a current generator, as shown in FIG. 2.

Though advantageous from some points of view, this solution presents also some drawbacks, the most serious of which is that in normal conditions of operation there is a considerable consumption of current I from the power supply to the output. Essentially there is a strong consumption of current I when, in conditions of normal operation, the transistor M2 is on.

Furthermore, the current I must be high enough to ensure that, when the signal VIN becomes null, the node B rapidly achieves the value of VOUT in order to avoid a cross conduction between the transistor M3 and the transistor M2 which form an inverter. This represents therefore a constraint against the actual reduction of such current I.

SUMMARY OF THE INVENTION

Embodiments of the present invention include a level shifter electronic device having structural and functional characteristics such as to allow a very low power consumption in normal operating conditions, further guaranteeing the output of a logic state "0" when the supply voltage of an input becomes null. This overcomes the drawbacks and the limits of the solutions proposed in the art.

In some embodiments, a local dynamic pull-down with a very low power consumption is used inside the level shifter device. On this basis, a level shifter device with very low power consumption is presented. The level shifter device includes a circuit portion with a differential cell having an output terminal and at least a first and a second input terminal. It also includes an additional circuit portion connected to a node of the differential cell that comprises at least a pull-down component inserted between the node and a second voltage reference.

The features and the advantages of the device according to the invention will be seen from the description, following herein, of an indicative and not limiting example of embodiment given with reference to the attached drawings.

DETAILED DESCRIPTION

Figure 3:
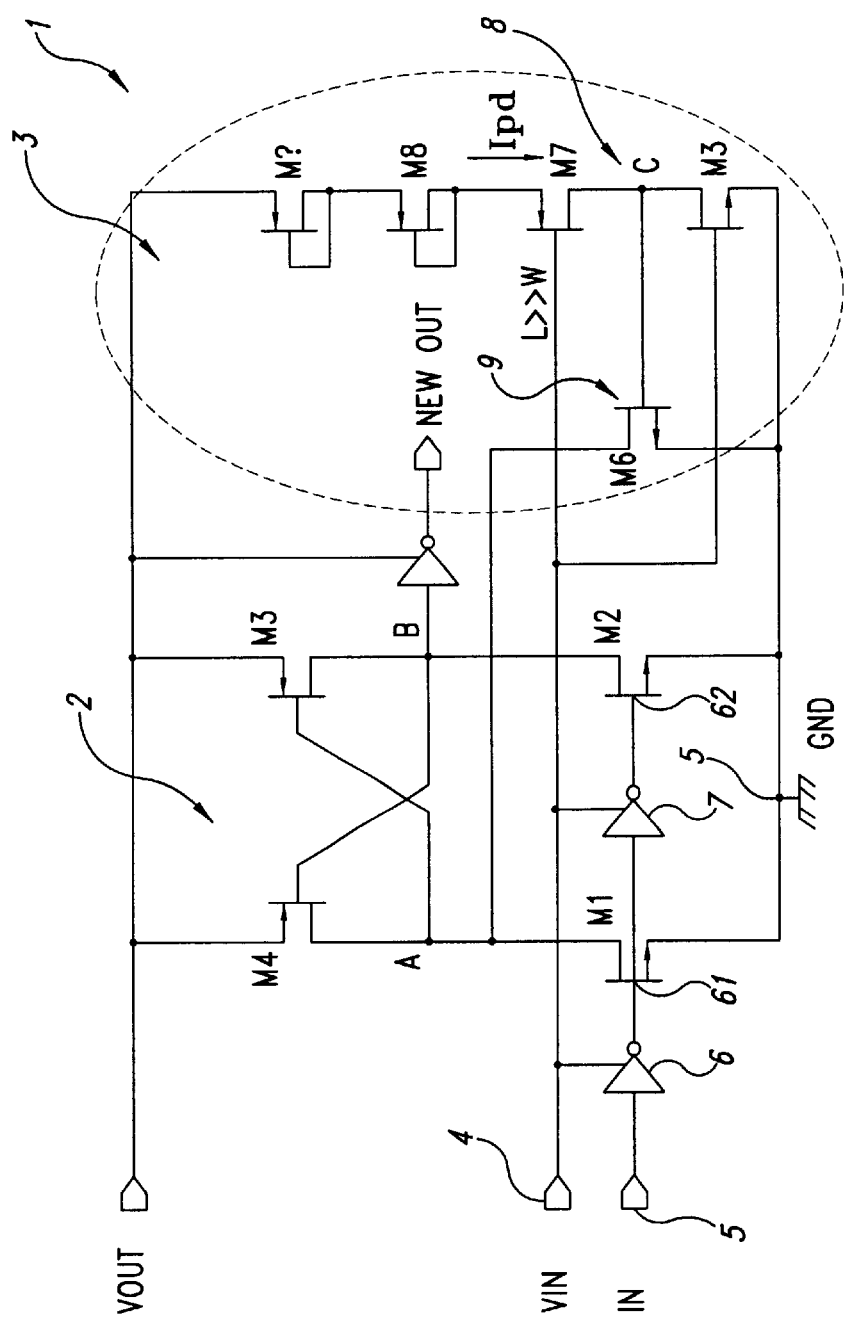
FIG. 3 shows a schematic view of a level shifter device realized according to an embodiment of the invention

With reference to the figures, and in particular to the example of FIG. 3, level shifter electronic device 1 including a charge regulator according to a first embodiment of the present invention is shown. A portable electronic instrument in which the level shifter electronic device 1 is placed is not shown in the drawings because it is conventional.

Even if hereinbelow reference shall be made to this specific field of application, it shall be understood that the level shifter according to embodiments of the invention can find application in any other field where a very low consumption of current in conditions of normal operation is needed.

Figure 1:
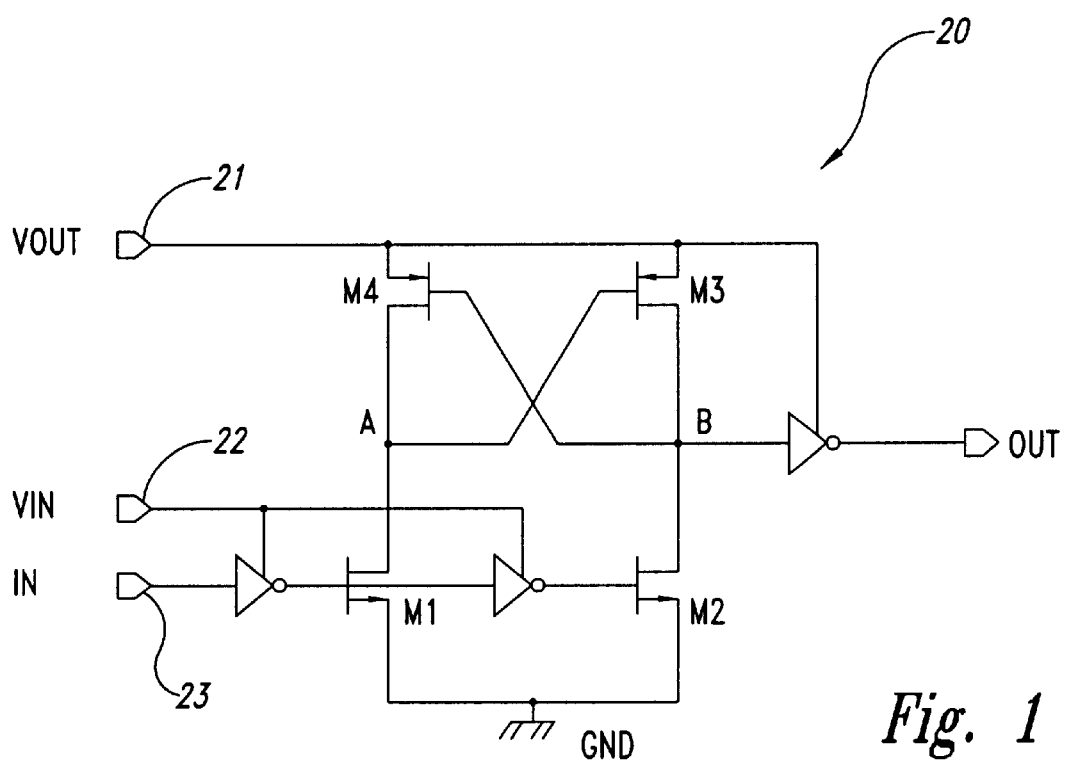
FIG. 1 shows a schematic view of a level shifter device realized according to the prior art.

The shifter device 1 includes a first circuit portion is a differential cell 2 that is structurally identical to that of a shifter of known type, for example as that illustrated in FIG. 1. The device 1 further comprises a second additional circuit portion 3 which will be described in detail hereinbelow.

The differential cell 2 is supplied between a first power supply voltage reference VOUT and a second voltage reference GND. The differential cell 2 can be considered as formed by two opposite circuit branches, each including an inverter with MOS transistor. The inverters of the two branches are each formed by a complementary pair of transistors and the respective interconnected nodes A and B between the transistor of each complementary pair are used also to interconnect the two circuit branches.

The differential cell 2 comprises two signal inputs 4 and 5 and an output NEW_OUT. This comprises a first pair of NMOS transistors, M1 and M2, respectively, having respective source terminals connected in a common node S connected to the voltage reference GND.

A gate terminal G1 of the transistor M1 is connected to the signal input 5 of the level shifter 1 by means of an inverter 6. The gate terminal of the transistor M2 is connected to the gate terminal G1 of the transistor M1 by means of an inverter 7. The inverters 6 and 7 are supplied by a signal VIN applied to the other signal input 4 of the level shifter 1.

The differential cell 2 also includes a pair of PMOS transistors M3 and M4, respectively, connected between the first power supply voltage reference VOUT and the first pair of transistors M1 and M2, respectively.

A drain terminal of the transistor M4 is connected to a gate terminal of the transistor M3 at a node A, which coincides with a drain terminal of the transistor M1. Furthermore, a drain terminal of the transistor M3 is connected to a gate terminal of the transistor M4 at a node B, which coincides with the drain terminal of the transistor M2.

Advantageously, according to this embodiment, the additional circuit portion 3 provides the level shifter 1 with an improved capacity of guaranteeing a low voltage level in the output signal VOUT in absence of a input signal. This is obtained by means of a dynamic pull-down with very low consumption.

To this end, the portion 3 includes an inverter 8 formed by a complementary pair of transistors M5 and M7, respectively, having their respective gate terminals connected to a common node X, which is connected to the input 4 of the level shifter.

The transistor M5 is of NMOS type and has a source connected to ground GND, whereas the transistor M7 is PMOS type and is connected to the power supply VOUT. Advantageously in one embodiment, the geometric ratio L/W, the length to width ratio of the channel region of the transistor M7, is dimensioned in such a way that L >>W.

Furthermore, once again according to an embodiment of the present invention, a pull-down component 9 is used to control connecting the node A of the differential cell 2 to ground GND. Such component 9 can be, for example, a MOS transistor M6.

An interconnection node C between the transistors M5 and M7 is connected to the gate terminal of the NMOS transistor M6, which has a source terminal connected to the voltage ground GND and a drain terminal connected to the node A of the differential cell 2.

A series of transistors M8, ..., Mn is inserted between the transistor M7 and the power supply reference VOUT. These transistors are PMOS type with a diode configuration, having their respective gate and drain terminals short-circuited. In normal operating conditions of normal operation of the shifter 1, a current Ipd flows through these transistors.

The operation of the level shifter device 1 according to this embodiment of the invention will now be described. When the input signal VIN on the input 4 is LOW, the transistor M5 is off and the gate of the transistor M6 (node C) is driven by means of the series of PMOS transistors M8, Mn and of the transistor M7 having L>>W. The number of transistors of the series can be adjusted according to the driving requirements of M6, and in order to reduce the power consumption of the transistor M5, when it is on.

The current Ipd that flows in this branch of the circuit portion 3 must be such to bring the voltage on the node C to a threshold voltage value sufficient to charge the gate capacity of the transistor M6, and switch it on.

In this condition, the node A is pulled to ground GND by the transistor M6, which turns on the transistor M3, forcing the node B to the value of the power supply VOUT. The output NEW_OUT of the level shifter 1 is thus LOW, that is at a logic value "0", having taken the output from node B through an inverter.

During a normal operation, that is when the voltage signal VIN is ON, the transistor M5 is always on, as its gate terminal is directly connected to the input 4 on which the signal VIN is present. This keeps the transistor M6 off, because node C is pulled to the ground voltage GND.

In this way, the current that flows in the two opposite branches of the differential cell 2 is in no way altered by the presence of the additional circuit, portion 3.

Figure 2:
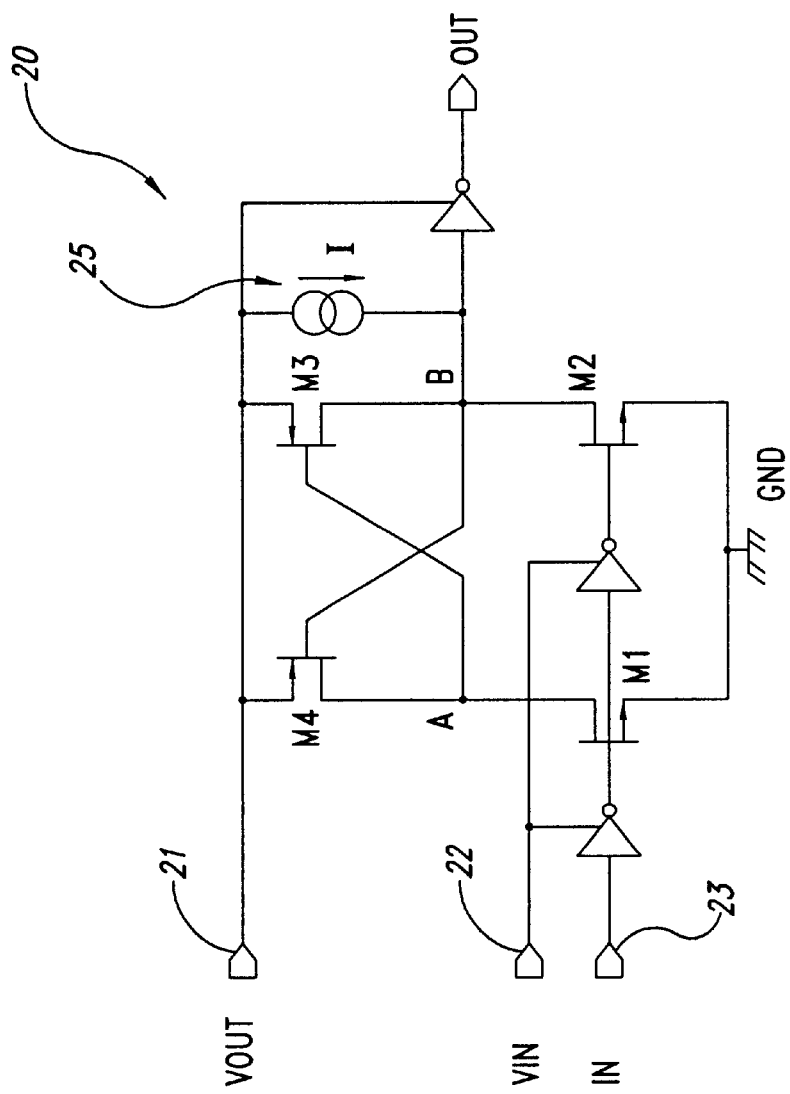
FIG. 2 shows a schematic view of a further example of embodiment of a level shifter realized according to the prior art.

Differently from the known solution shown in FIG. 2, the solution according to this embodiment of the present invention has only a modest consumption of current Ipd, which is the only one provided, focalized in the branch of the portion 3, comprising the series of PMOS transistors. Such consumption of current Ipd is dependent on a number of factors, such as the number of PMOS transistors M8, ..., Mn, the length of the channel of the PMOS transistor M7, and on the difference between the voltage-values VIN and VOUT.

For the shifter according to this embodiment of the invention, the following relationship is true:

$$Ipd\ (K/2)\ (W_{M7}/L_{M7})\ [2*\ (Vgs_{M7}-Vt)*(Vds_{M7}-Vds_{M7}^2]$$

With:

$$Vgs_{M7}=VIN-(VOUT-nVt)$$

$$Vds_{M7}=-(VOUT-nVt)$$

wherein n=number of PMOS transistors with short-circuited gate and drain terminals Vt=threshold voltage of the PMOS transistors with the Body effect being considered.

Figure 4A:
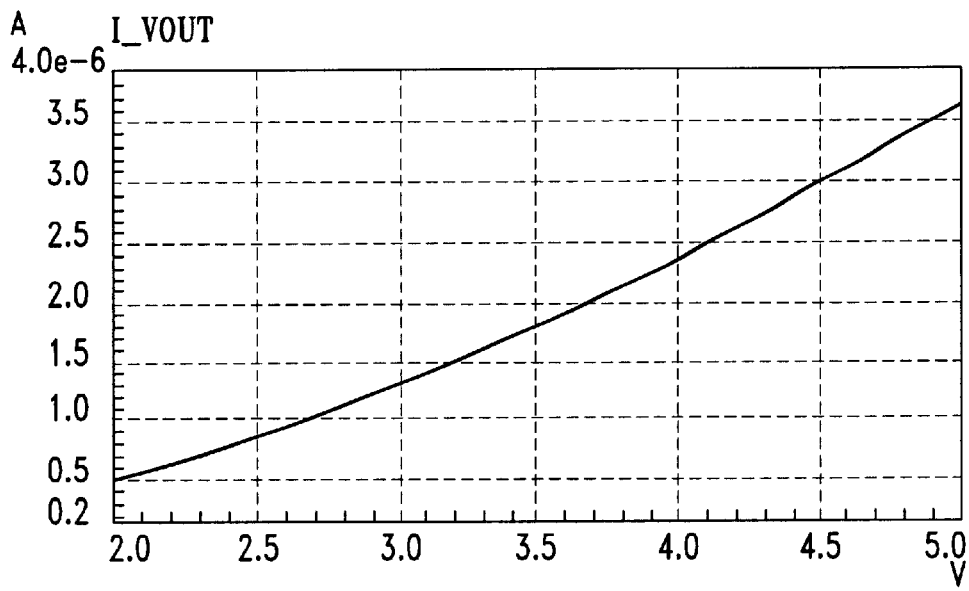
FIGS. 4A and 4B show schematic views of characteristic current-voltage diagrams corresponding to a known solution and to a solution according to an embodiment of the invention respectively.
Figure 4B:
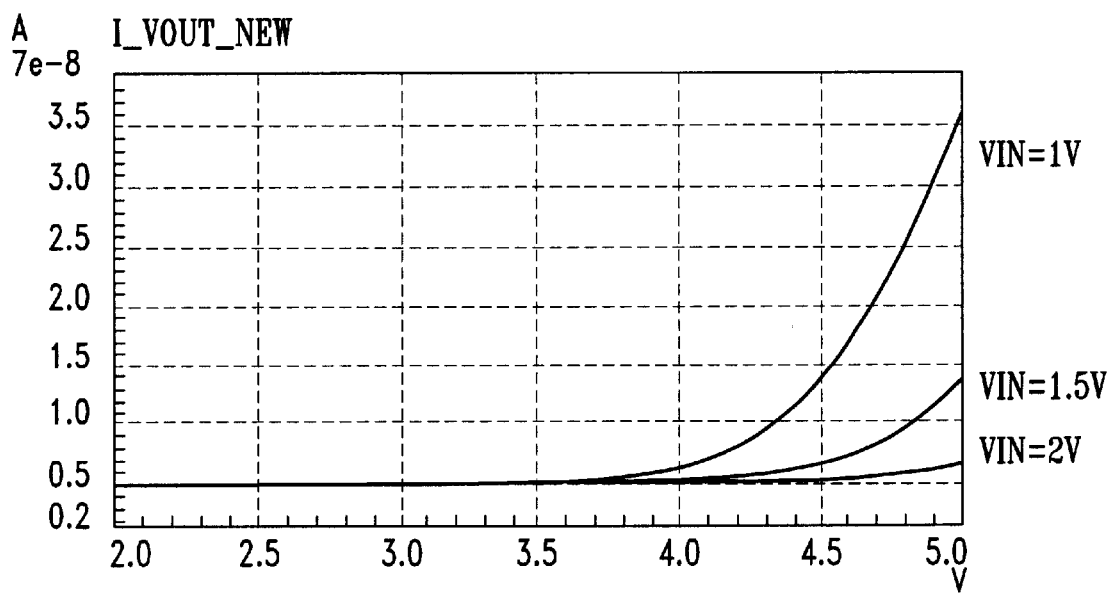

In FIGS. 4A and 4B the results of some electric simulations are shown, which were carried out by the applicant on the level shifter according to an embodiment of the invention. In this specific case, a comparison between this embodiment of the invention and the known solution of FIG. 2 was carried out, wherein a PMOS transistor having the same characteristics of the transistor M7 and with the gate terminal connected to ground was used as current generator I.

For only purposes of the simulation, the invention was implemented with a series of only three PMOS transistors M8, M9 and M10 respectively, having their respective body terminals connected to the reference of voltage VOUT. The signal IN was at logic value "1". Therefore, the two circuits were in the worst conditions of operation as far as the consumption of electric current is concerned From the comparison between the FIGS. 4A and 4B it is fully apparent that the total savings of current are in favor of the solution according to this embodiment of the present invention. The two diagrams show in particular the amount of current absorbed when the power supply VOUT varies.

Figure 5A:
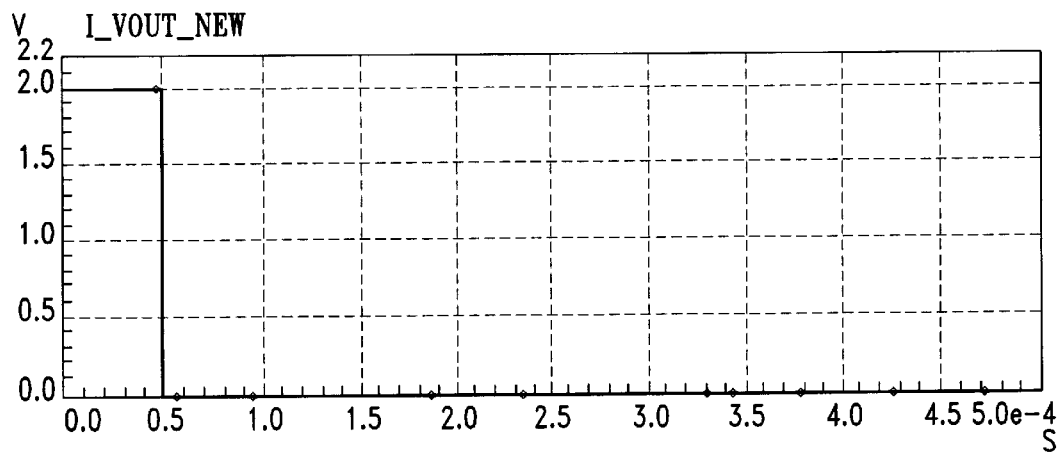
FIGS. 5A, 5B and 5C show on respective voltage-time diagrams, a pattern of voltage signals present in the shifter according an embodiment of the invention.
Figure 5B:
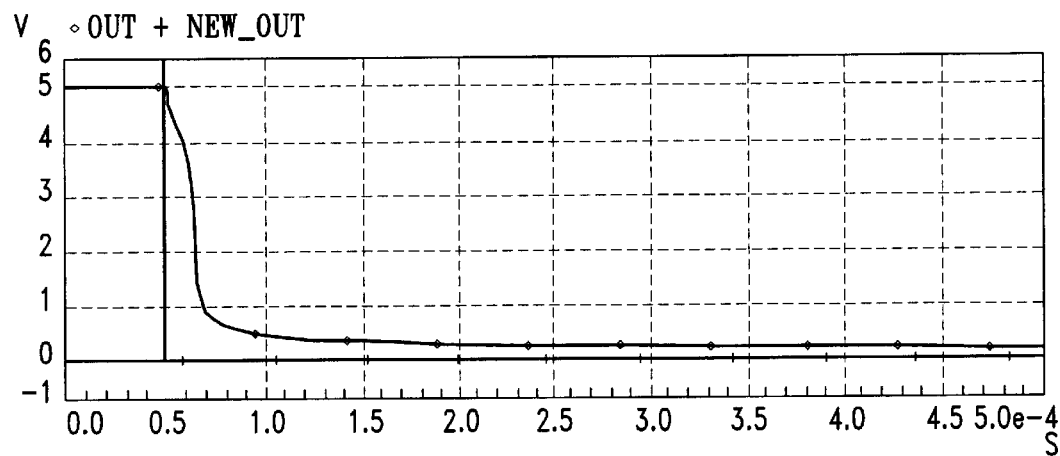
Figure 5C:
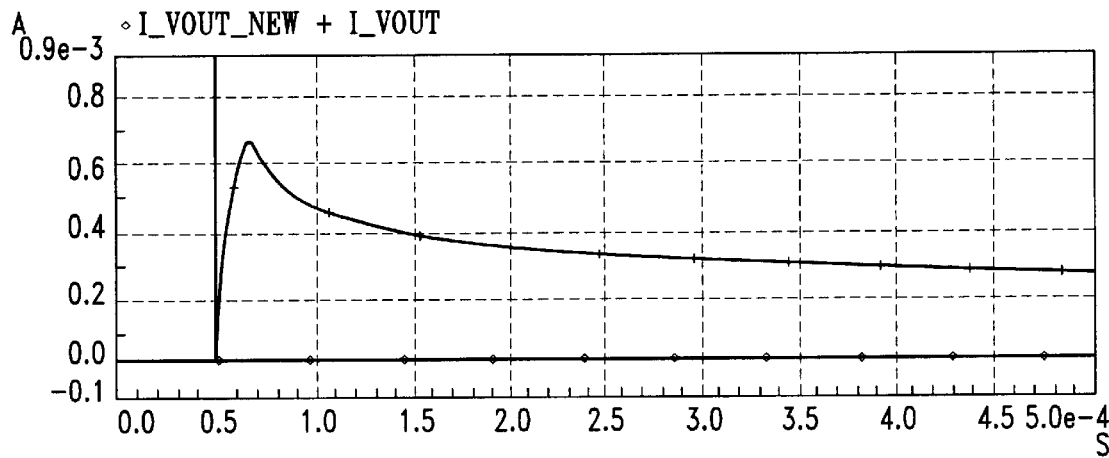

In FIGS. 5A, SB and SC, the responses of both circuits, of the known prior art type and according to the same embodiment of the invention, can be appreciated when the signal VIN becomes 0 V and in the operative condition when the signal IN is at the logic value "1".

Upon further assumption to design the two circuits in such a way that they have approximately the same consumption of current in operative conditions, the solution according to this embodiment of the invention shows a response to the transient which is much faster, and, above all, does not show any consumption of current after the signal VIN becomes 0 V. In the known solution of FIG. 2, on the contrary, a cross-conduction of current due to the low charge of the node B is present.

The embodiments of the invention achieve a number of advantages, for instance being able to provide a low consumption of current in normal conditions of operation. Additionally, the shifter according to embodiments of the invention do not alter the current that flows in the two branches of the differential stage of the level shifter when the voltage VIN is present. At equal consumption, the integrated circuit area taken up by the shifter according to embodiments of the invention are much smaller and the response time is much faster.

What is claimed is:

1. A level shifter electronic device with very low power consumption, the electronic device comprising:
   a first power supply voltage, a second power supply voltage, and a reference voltage, the first power supply voltage being lower than the second power supply voltage;
   a differential shifting circuit coupled to the first and second power supply voltages and the reference voltage, the differential shifting circuit having an input node with a voltage depending on the first power supply voltage and having an intermediate node with a voltage depending on the second power supply voltage and an output terminal having an output voltage depending on the voltage at the intermediate node;
   a pull-down component coupled between the intermediate node and the reference voltage and having a control node; and
   a monitoring circuit having an input coupled to the first power supply voltage and an output coupled to the control node of the pull-down component, the monitoring circuit being structured to activate the pull-down component in response to detecting that the first power supply voltage is inactive.

2. The level shifter electronic device according to claim 1 wherein the pull-down component is a MOS transistor having conduction terminals connected between the interconnection node and the reference voltage.

3. The level shifter electronic device according to claim 1 wherein the monitoring circuit includes a series of transistors between the control node of the pull-down component and the second power supply voltage.

4. The level shifter electronic device according to claim 3 wherein the monitoring circuit further includes a further transistor connected between the series of transistors and the reference voltage.

5. The level shifter electronic device according to claim 4 wherein the control node of the pull-down component is coupled to a node between the further transistor and the series of transistors.

6. The level shifter electronic device according to claim 3 wherein at least one transistor in the series of transistors is a diode-connected PMOS transistor.

7. The level shifter electronic device according to claim 3 wherein a first transistor of the series of transistors has a gate terminal connected to the first power supply voltage.

8. The level shifter electronic device according to claim 7 wherein the first transistor of the series of transistors is dimensioned so that a length of a channel region of the first transistor is much greater than a width of the channel region.

9. The level shifter electronic device according to claim 1 wherein the differential shifting circuit includes:
   a first pull-up transistor coupled between the second power supply voltage and the intermediate node and having a control terminal;
   a second pull-up transistor cross-coupled with the first pull-up transistor, the second pull-up transistor having a first conduction technical coupled to the second power supply voltage and a second conduction terminal coupled to the control terminal of the first pull-up transistor; and
   an inverter coupled between the second conduction terminal and the output terminal.

10. A level shifter electronic device with very low power consumption, the electronic device comprising:
    a level shifting circuit coupled to first and second power supply voltages and a reference voltage, the first power supply voltage being lower than the second power supply voltage, the level shifting circuit having an input node with a voltage depending on the first power supply voltage and having intermediate node with a voltage depending on the second power supply voltage and an output terminal having an output voltage depending on the voltage at the intermediate node;
    a pull-down transistor coupled between the intermediate node and the reference voltage and having a control node; and
    a monitoring circuit having an input coupled to the first power supply voltage and an output coupled to the control node of the pull-down transistor, the monitoring circuit being structured to activate the pull-down component in response to detecting that the first power supply voltage is inactive.

11. The level shifter electronic device according to claim 10 wherein the monitoring circuit includes a further transistor connected between the control node of the pull-down transistor and the reference voltage.

12. The level shifter electronic device according to claim 10 wherein the monitoring circuit includes a series of transistors between the control node of the pull-down transistor and the second power supply voltage.

13. The level shifter electronic device according to claim 12 wherein a first transistor of the series of transistors has a gate terminal connected to the first power supply voltage.

14. The level shifter electronic device according to claim 10 wherein the differential shifting circuit includes:
   a first pull-up transistor coupled between the second power supply voltage and the intermediate node and having a control terminal;
   a second pull-up transistor cross-coupled with the first pull-up transistor, the second pull-up transistor having a first conduction terminal coupled to the second power supply voltage and a second conduction terminal coupled to the control terminal of the first pull-up transistor; and
   an inverter coupled between the second conduction terminal and the output terminal.

15. A level shifter electronic device, comprising:
   level shifting means for receiving an input signal having either a first level or a second level and producing an output signal having either the first level or a third level when a first power voltage is active, the third level being higher than the second level which is higher than the first level;
   monitoring means for monitoring the first power voltage and, in response to detecting that the first power voltage is inactive, causing the level shifting means to hold the output signal at the first level.

16. The level shifter electronic device according to claim 15 wherein the level shifting means includes an output transistor coupled to a second power voltage and to an output node at which the output signal is produce, the output transistor having a control terminal and wherein the monitoring means includes:
   a pull-down transistor coupled between the control terminal of the output transistor and a reference voltage at the first level; and
   a monitor transistor connected between the second power voltage and a control node of the pull-down transistor and having a control terminal coupled to the first power voltage.

17. The level shifter electronic device according to claim 16 wherein the monitoring means includes a further transistor connected between the control node of the pull-down transistor and the reference voltage.

18. The level shifter electronic device according to claim 16 wherein the monitoring means includes a series of transistors between the control node of the pull-down transistor and the second power voltage.

19. The level shifter electronic device according to claim 15 wherein the level shifting means includes:
   a first pull-up transistor coupled between a second power voltage and an intermediate node and having a control terminal;
   a second pull-up transistor cross-coupled with the first pull-up transistor, the second pull-up transistor having a first conduction terminal coupled to the second power voltage and a second conduction terminal coupled to the control terminal of the first pull-up transistor;
   an inverter coupled between the second conduction terminal and an output terminal at which the output signal is produced; and
   a pull-down transistor coupled between the intermediate node and a reference voltage at the first level.

* * * * *

UNITED STATES PATENT AND TRADEMARK OFFICE
CERTIFICATE OF CORRECTION

PATENT NO. : 6,285,233 B1  Page 1 of 1
DATED : September 4, 2001
INVENTOR(S) : Calogero Ribellino et al.

It is certified that error appears in the above-identified patent and that said Letters Patent is hereby corrected as shown below:

Title page,
Item [30] Foreign Application Priority date should read -- October 28, 1998 --.

Signed and Sealed this

Twelfth Day of March, 2002

Attest:

JAMES E. ROGAN
Attesting Officer   Director of the United States Patent and Trademark Office